United States Patent [19]

Zwicknagl et al.

[11] Patent Number: 4,904,612
[45] Date of Patent: Feb. 27, 1990

[54] METHOD FOR MANUFACTURING A PLANAR, SELF-ALIGNED EMITTER-BASE COMPLEX

[75] Inventors: Hans-Peter Zwicknagl, Stuttgart; Josef Willer, Oberschleissheim; Helmut Tews, Unterhaching, all of Fed. Rep. of Germany

[73] Assignee: Siemens Aktiengesellschaft, Berlin and Munich, Fed. Rep. of Germany

[21] Appl. No.: 374,617

[22] Filed: Jun. 30, 1989

Related U.S. Application Data

[63] Continuation of Ser. No. 261,492, Oct. 24, 1988, abandoned.

[30] Foreign Application Priority Data

Oct. 23, 1987 [DE] Fed. Rep. of Germany ....... 3735999

[51] Int. Cl.$^4$ .......................................... H01L 21/265
[52] U.S. Cl. ...................................... 437/31; 357/34; 148/DIG. 11; 437/133; 437/228
[58] Field of Search .................. 437/31, 32, 33, 24, 437/126, 133, 184, 188, 202, 228, 238; 148/DIG. 10, DIG. 11, DIG. 51; 357/34, 35; 156/643, 652, 653, 657

[56] References Cited

U.S. PATENT DOCUMENTS

| | | | |
|---|---|---|---|
| 4,389,281 | 6/1983 | Anantha et al. | |
| 4,472,874 | 9/1984 | Kurosawa et al. | |
| 4,474,623 | 10/1984 | Alderstein | |
| 4,481,706 | 11/1984 | Roche | |
| 4,617,724 | 10/1986 | Yokoyama et al. | |
| 4,679,305 | 7/1987 | Morizuka | |
| 4,683,487 | 7/1987 | Ueyanagi et al. | |
| 4,731,340 | 5/1988 | Chang et al. | 437/238 |
| 4,752,589 | 6/1988 | Schaber | 437/59 |
| 4,774,206 | 9/1988 | Willer | 437/175 |

FOREIGN PATENT DOCUMENTS

| | | |
|---|---|---|
| 0067419 | 9/1982 | European Pat. Off. |
| 0164281 | 12/1985 | European Pat. Off. |
| 0062883 | 7/1986 | European Pat. Off. |
| 0213919 | 8/1986 | European Pat. Off. |
| 0227303 | 11/1986 | European Pat. Off. |
| 1947026 | 3/1971 | Fed. Rep. of Germany |
| 3511229 | 3/1985 | Fed. Rep. of Germany |
| 3545244 | 6/1987 | Fed. Rep. of Germany |

OTHER PUBLICATIONS

K. Ishii et al., "High-Temperature Stable $W_5Si_3/In_{0.53}Ga_{0.47}As$ Ohmic Contacts to GaAs for Self-Asigned HBTS", IEDM 1986, pp. 274–277.

Sandip Tiwari, "GaAlAs/GaAs Heterostructure Bipolar Transistors: Experiment and Theory", IEDM 1986, pp. 262–265.

M. F. Chang et al., "GaAs/(GaAl)As Heterojunction Bipolar Transistors Using a Self-Aligned Substitutional Emitter Process", IEEE Electron Device Letters, vol. EDL-7, No. 1, Jan. 1986, pp. 8–10.

F. Clauwaert et al., "Characterization of Device Isolation in GaAs Mesfet Circuits by Boron Implantation", J. Electrochem. Soc.: Solid-State Science and Technology, Mar. 1987, pp. 711–714.

IBM Technical Disclosure Bulletin, "Process for Making Metal Contacts to Shallow Junctions", vol. 28, No. 3, Aug. 1985, pp. 1133–1134.

(List continued on next page.)

Primary Examiner—Brian E. Hearn
Assistant Examiner—Kevin McAndrews
Attorney, Agent, or Firm—Hill, Van Santen, Steadman & Simpson

[57] ABSTRACT

A method for the manufacture of a planar, self-aligned emitter-base complex, whereby a semiconductor layer structure standard for hetero-bipolar transistors is first grown on a substrate, the base regions are subsequently etching through a mask technique and are provided with the base metallization and with a first dielectric layer and insulation implantations and spacers for electrical insulation of the base are manufactured, and, following thereupon, the emitter region is provided with the emitter metallization and with a third dielectric layer.

20 Claims, 5 Drawing Sheets

OTHER PUBLICATIONS

IBM Technical Disclosure Bulletin, "Isolation and Interconnect Scheme for Sidewall Contact Structures", vol. 29, No. 5, Oct. 1986, pp. 2156–2159.

John W. Tully, "A Fully Planar Heterojunction Bipolar Transistor", IEEE Electron Device Letters, vol. EDL-7, No. 11, Nov. 1986, pp. 615–617.

Mau-Chung F. Chang et al., "AlGaAs/GaAs Heterojunction Bipolar Transistors Fabricated Using a Self-Aligned Dual-Lift-Off Process", IEEE Electron Device Letters, vol. EDL-8, No. 7, Jul. 1987, pp. 303–305.

Kazuo Eda et al., "Emitter-Base-Collector Self-Aligned Heterojunction Bipolar Transistors Using Wet Etching Process", IEEE Electron Device Letters, vol. EDL-7, No. 12, Dec. 1986, pp. 694–696.

T. Ishibashi et al., "High-Speed Frequency Dividers Using Self-Aligned AlGaAs/GaAs Heterojunction Bipolar Transistors", IEEE Electron Device Letters, vol. EDL-8, No. 5, May 1987, pp. 194–196.

METHOD FOR MANUFACTURING A PLANAR, SELF-ALIGNED EMITTER-BASE COMPLEX

This is a continuation of application Ser. No. 261,492, filed 10-24-88, now abandoned.

BACKGROUND OF THE INVENTION

The present invention relates to the manufacture of a planar, self-aligned emitter-base complex.

In the manufacture of hetero-bipolar transistors, the emitter-base complex is typically manufactured first. To this end, a layer sequence of different and differently doped semiconductor materials is applied on a substrate. As a rule, the uppermost part of these layers is doped for the conductivity type of the emitter and is provided with a corresponding contact. The semiconductor layer, which is doped for the formation of the base, lies somewhat deeper and must be exposed for the contacting. This can occur, for example, by local etching and re-doping of the oppositely doped layers situated thereabove.

In order to optimize the electrical properties of such an emitter-base complex, the spacing between the base and emitter must be kept as small as possible without having these two regions short-circuited. Because the geometrical dimensions are extremely small, various self-aligning manufacturing processes for hetero-bipolar transistors have been recently proposed.

In M. F. Chang et al, "GaAs/(GaAl)As Heterojunction Bipolar Transistors Using a Self-Aligned Substitutional Emitter Process", IEEE Electron Device Letters EDL-7, 8–10 (1986), a photomask layer serves for the definition of the emitter region and as a mask for the etching and subsequent doping of the base regions. An implantation step is required because the upper layers are not completely etched off down to the layer doped for the base. This doping, that is additionally introduced, is subsequently annealed and a dielectric for the formation of spacers is applied. The spacers function to apply a separate metallization of emitter and base.

In the publication Ishii et al, "High-Temperature Stable $W_5Si_3/In_{0.53}Ga_{0.47}As$ Ohmic Contacts to GaAs for Self-Aligned HBTs", IEDM 86, pages 274–277, a self-aligning process is disclosed for manufacturing a hetero-bipolar transistor wherein the emitter metallization of $WSi_x$ serves as a mask for etching off the upper semiconductor layers doped for the conductivity type of the emitter and also for the implantation, that is also required, for doping the uppermost layers of the base region. Subsequently, this additional doping is annealed through a rapid annealing method and the emitter metallization is alloyed in. Finally, the base metallization is applied.

The publication S. Tiwari, "GaAlAs/GaAs Heterostructure Bipolar Transistors: Experiment and Theory", IEDM 86, pages 262–265 discloses a method for the manufacture of hetero-bipolar transistors on the basis of GaAs wherein the base-emitter complex is constructed self-aligning. This manufacturing process yields a planar structure. In this method, the base-emitter region is first fashioned as a mesa. The vertical sidewalls are produced from the GaAs contact layer by RIE, whereupon a silicon nitride layer is deposited on the free surface. The high-temperature stable ohmic emitter contact is based on an $n^+$-doped InAs layer. A tungsten silicide film is deposited on this layer in order to form the ohmic contact. With this applied emitter contact, the $p^+$-implantations of the base region are subsequently annealed by rapid thermal annealing at temperatures between 800° C. and 900° C., the length of the anneal is less than five seconds. Based on particulars of the author, a contact resistance below $2 \times 10^{-6}$ ohms $\times$ cm$^2$ subsequently results.

SUMMARY OF THE INVENTION

The present invention provides a method for the manufacture of a planar, self-aligned emitter-base complex.

In an embodiment, the present invention provides a method for the manufacture of a planar, self-aligned emitter-base complex including a substrate of semiconductor material on which a semiconductor layer structure standard for hetero bipolar transistors is grown, whereby at least one semiconductor layer is doped for the conductivity type of the base, and including: a passivation layer; a base metallization, a portion of a first dielectric layer situated thereon; and an emitter metallization, a portion of a second dielectric layer situated thereon. The method utilizing phototechnique and lift-off technique, etching technique, implantation and tempering processes.

The method comprising the following steps: proceeding from the substrate comprising the semiconductor layer structure grown thereon, a passivation layer is deposited surface-wide on the uppermost of the semiconductor layer; a first mask layer including an opening for the definition of the base is applied; an implantation of doping for the conductivity type of the base proceeds first for the formation of base implants through the passivation layer at least down to the semiconductor layer doped for the conductivity type of the base, and second, the passivation layer and the uppermost semiconductor layer are etched away in those regions occupied by the opening of the first mask layer that serves the purpose of defining the base, a first metal layer including a first portion as base metallization and having a second portion is applied on the first mask layer; a high-temperature resistant metal is utilized for the first metal layer, so that the base metallization is not negatively influenced by a subsequent tempering cycle for annealing the doping; a first dielectric layer including a first portion on the base metallization and having a second portion on the second portion of the first metal layer is deposited; the first mask layer together with the second portion of the first metal layer and the second portion of the first dielectric layer are removed in a lift-off technique; a temperature-time cycle is then carried out with which the implanted doping is annealed and the base metallization is alloyed in at the same time; a second dielectric layer is isotropically deposited; the second dielectric layer and the passivation layer are etched away to such an extent, with anisotropic etching, that only spacers completely covering the sides of the base metallization remain; a second mask layer for the definition of the emitter is applied; a second metal layer having a first portion as an emitter metallization and including a second portion is applied on the second mask layer; a third dielectric layer having a first portion on the emitter metallization and a second portion on the second portion of the second metal layer is applied; the second mask layer together with the second portion of the second metal layer and the second portion of the third dielectric layer are removed in a lift-off technique; the emitter metallization is alloyed in; the exposed portions of the uppermost semiconductor layer are etched away; and those portions of the semiconductor layer structure located outside the regions of the surface occupied by the emitter and base are rendered insulating by insulation implantation at that side facing away from the substrate down to and including the semiconductor layer doped for the conductivity type of the base.

In an embodiment, another method is provided for the manufacture of a planar, self-aligned emitter-base complex comprising a substrate standard of semiconductor material on which a semiconductor layer structure as for hetero-bipolar transistors is grown thereon, at least one of the semiconductor layers is doped for the conductivity type of the base, and including: a passivation layer; a base metallization and a portion of a first dielectric layer situated thereon; and an emitter metallization and a portion of a second dielectric layer situated thereon. The method utilizing phototechnique, lift-off technique, etching technique, implantation and tempering processes.

The method comprises the following steps: proceeding from the substrate comprising the semiconductor layer structure grown thereon, a passivation layer is deposited surface-wide on the uppermost of these semiconductor layers; a first mask layer having an opening for the definition of the base is applied; an implantation of doping for the conductivity type of the base is carried out first for the formation of base implantates through the passivation layer at least down to the semiconductor layer doped for the conductivity type of the base, and second, the passivation layer and the uppermost semiconconductor layer are etched away in the regions occupied by the opening of the first mask layer serving for the definition of the base; a first metal layer having a first portion as base metallization and including a second portion on the first mask layer is applied; a high-temperature resistant metal is utilized for this first metal layer, so that the base metallization is not negatively influenced by a following tempering cycle for annealing the doping; a first dielectric layer having a first portion on the base metallization and including a second portion on the second portion of the first metal layer is deposited; the first mask layer together with the second portion of the first metal layer and the second portion of the first dielectric layer are removed in lift-off technique; a temperature-time cycle is carried out with which the implanted doping is annealed and the base metallization is alloyed in at the same time; a second dielectric layer is isotropically deposited; the second dielectric layer and the passivation layer are etched away to such an extent, with anisotropic etching, that only spacers completely covering the sides of the base metallization remain; a second metal layer is deposited onto the surface having the base metallization; a third dielectric layer is deposited on the second metal layer; a second mask layer is applied for the definition of the emitter; those parts of the second metal layer and of the third dielectic layer not covered by the second mask layer are etched away with anisotropic etching, so that only the emitter metallization of the second metal layer remains; the second mask layer is removed; the emitter metallization is alloyed in; the exposed portions of the uppermost semiconductor layer are etched away; and those portions of the semiconductor layer structure located outside of the regions of the surface occupied by the base and emitter are rendered insulating by insulation implantation at that side facing away from the substrate down to and including the semiconductor layer doped for the conductivity type of the base.

The present invention thereby provides a manufacturing method for self-aligned, planar emitter-base complexes for hetero-bipolar transistors, particularly on the basis of GaAs.

Additional features and advantages of the present invention will be apparent from the detailed description of the presently preferred embodiments and from the drawings.

DETAILED DESCRIPTION OF THE PRESENTLY PREFERRED EMBODIMENTS

Figure 1:
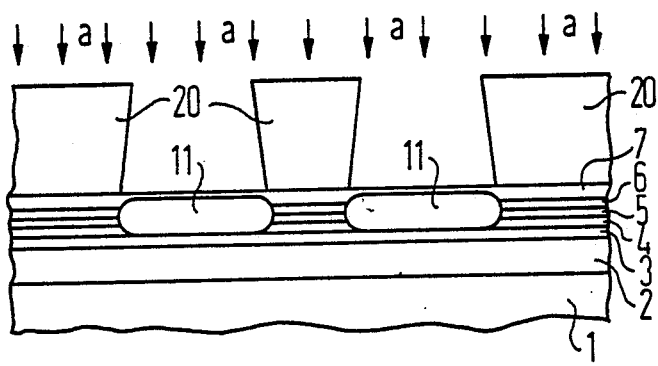
FIG. 1 illustrates a cross-sectional view of an emitter-base complex following a third method step of the present invention.

The present invention provides methods for manufacturing a planar, self-aligned emitter-base complex.

The method of the present invention shall be set forth below for a transistor based on GaAs. However, the method of the present invention can also be used for the manufacture of hetero-bipolar transistors constructed from different materials, different layer structures, and having deviations of geometry. The method of the present invention can be modified for these additional uses without difficulty. Accordingly, the embodiments of the present invention set forth below are given by way of example, and not limitation.

A layer sequence of semiconductor material, that is standard for the manufacture of hetero-bipolar transistors, is applied on a substrate 1 of III-V semiconductor material, for example semi-insulating gallium arsenide. A first semiconductor 2 of n-conductively doped GaAs, a second semiconductor layer 3 of p-conductively doped GaAs, a third semiconductor layer 4 of n-conductively doped AlGaAs, a fourth semiconductor layer 5 of n-conductively doped GaAs, and a fifth semiconductor layer 6 of highly n-conductively doped GaAs are successively grown on the substrate 1 of GaAs. This layer sequence is covered with an approximately 150 nm thick passivation layer 7 composed of a dielectric, for example $Si_3N_4$.

In a second step of the process of the present invention, a first mask layer 20, for example a photoresist mask, having an opening for the definition of the base is applied. An implantation of p-doping (a) for the formation of the base implants 11 follows in a third step of the process of the present invention through the opening of the first mask layer 20 and through the passivation layer 7. The p-doping (a) extends at least down to the second semiconductor layer 3 of the p-conductively doped GaAs. FIG. 1 illustrates a cross-sectional view through an emitter-base complex following this third method step.

In a fourth step of the process of the present invention, the passivation layer 7 and the uppermost semiconductor layer 6 are etched off in the regions that are not covered by the first mask layer 20. The fourth step can also be preformed preceding the third step when the required doping profile is produced on the basis of suitable measures.

In a fifth step of the process of the present invention, a first metal layer 8, 18, that is usually multi-layer, is applied. A first portion of the metal layer 8 forms the base metallization 8. A second portion 18 of the first metal layer is located on the first mask layer 20. A metallization that is high-temperature resistant when situated on the p-conductively doped semiconductor material is used for the first metal layer 8, 18. By way of example, titanium can be used first, followed by platinum and either titanium again or gold is used as the third metal. A metallization composed of five layers yields the sequence titanium, platinum, gold, titanium, and platinum. What is thereby critical is that the metallization can survive a following temperature time cycle for annealing the base implant 11 such that the contact resistances are adequately low for the functioning of the transistor.

Figure 2:
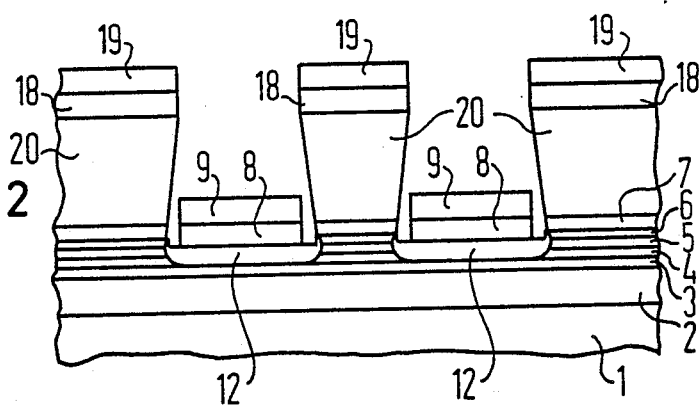
FIG. 2 illustrates a cross-sectional view of an emitter-base complex following a sixth method step of the present invention.

In a sixth step of the process of the present invention, a first dielectric layer 9, 19 of, for example, $SiO_2$ is deposited. The dielectric layer can be deposited at a thickness of approximately 200 nm. A first portion 9 of this first dielectric layer is located on the base metallization 8. A second portion 19 of this first dielectric layer is situated on the second portion 18 of the first metal layer. FIG. 2 illustrates a cross-sectional view of an emitter-base complex following this sixth method step.

Figure 3:
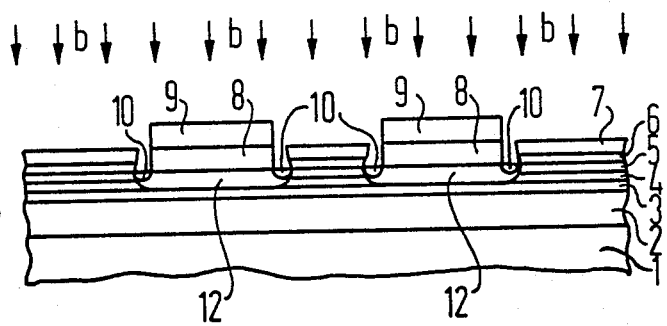
FIG. 3 illustrates a cross-sectional view of an emitter-base complex following a seventh method step of the present invention.

In a seventh step of the process of the present invention, the first mask layer 20 together with a second portion 18 of the first metal layer and a second portion 19 of the first dielectric layer situated thereon are removed (lift off). FIG. 3 illustrates a cross-sectional view of an emitter-base complex following this seventh method step.

In an eighth step of the process of the present invention, the annealing of the implanted doping is carried out by a temperature-time cycle with which the base metallization 8 is alloyed in at the same time. Because of the cited metallizations, a short rapid annealing process can be utilized. To this end, the annealing occurs at a temperature of between approximately 850° C. to about 900° C. and through a time duration of approximately 2 to about 3 seconds. In an embodiment of the method of the present invention, the insulating implantates 10 for insulating the base regions 12 from the n-conductively doped layers situated around the base regions 12 are introduced either preceding or following the annealing step (step 8).

Figure 4:
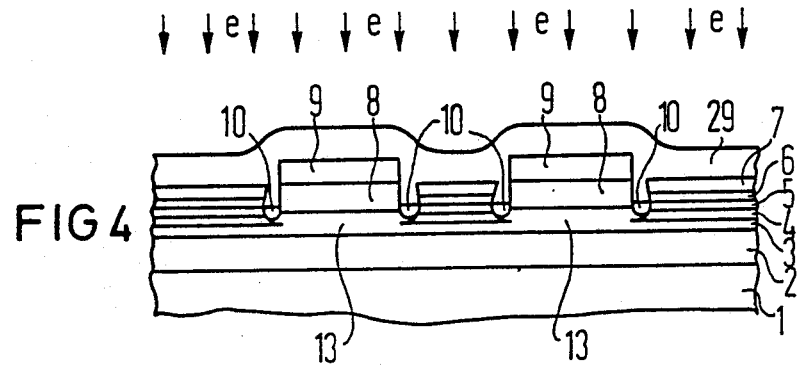
FIG. 4 illustrates a cross-sectional view of an emitter-base complex following a ninth method step of the present invention.

In a ninth step of the process of the present invention, a second dielectric layer 29 of, for example, silicon nitride, that forms a layer adequately thick for the subsequent formation of spacers, is isotropically deposited surface-wide or at least covering the region of the base to be fashioned. FIG. 4 illustrates a cross-sectional view of the emitter-base complex following this ninth method step.

Figure 5:
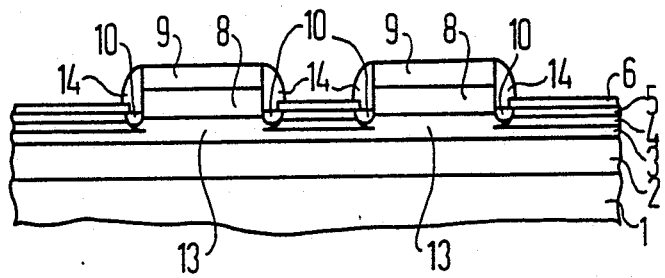
FIG. 5 illustrates a cross-sectional view of an emitter-base complex following a tenth method step of the present invention.

In a tenth step of the method of the present invention, the second dielectric layer 29 and the passivation layer 7 are etched away with anisotropic etching. The second dielectric layer 29 and passivation layer 7 are etched away to such an extent that spacers 14 remain that only cover the sides of the base metallizations 8 applied on the base regions 12 and further cover first portions 9 of the first dielectric layer. The sides of the base metallizations 8, in particular, are covered in a completely insulating fashion. FIG. 5 illustrates a cross-sectional view of an emitter-base complex following this tenth method step.

In an eleventh step of the method of the present invention, a second mask layer 21, that can again be a photoresist mask, is applied having an opening for the definition of the emitter. In a twelfth step of the method of the present invention, following the eleventh step, a second metal layer comprising a first portion as emitter metallization 15 and a second portion 25 is deposited on the second mask layer 21.

Figure 6:
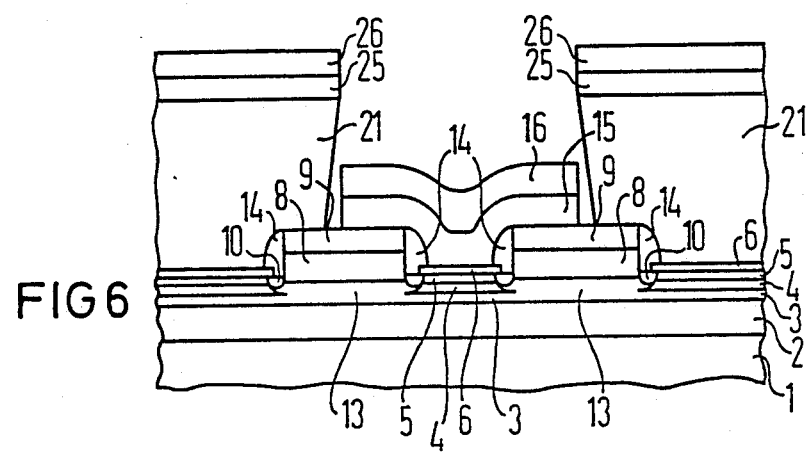
FIG. 6 illustrates a cross-sectional view of an emitter-base complex following a thirteenth method step of an embodiment of the present invention.

In a thirteenth step of the method of the present invention, a third dielectric layer including a first portion 16 on the emitter metallization 15 and a second portion 26 on the second portion 25 of the second metal layer located on the second mask layer 21 is applied. FIG. 6 illustrates a cross-sectional view of the emitter-base complex following this thirteenth method step.

Figure 7:
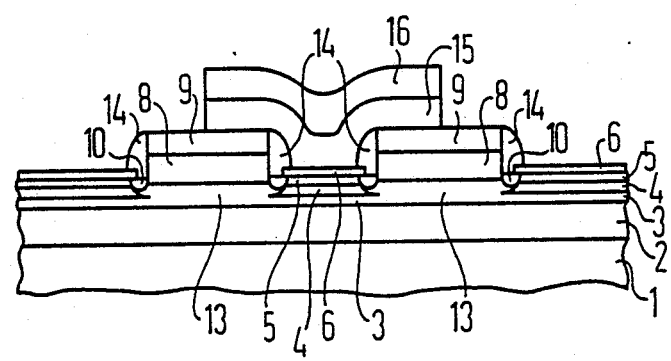
FIG. 7 illustrates a cross-sectional view of an emitter-base complex following a fourteenth method step of an embodiment of the present invention.

In a fourteenth step of the method of the present invention, the second mask layer 21 together with a second portion 25 of the second metal layer located thereon, and together with the second portion 26 of the third dielectric layer, are removed (lift off). FIG. 7 illustrates a cross-sectional view of an emitter-base complex following this fourteenth method step.

In a fifteenth step of the method of the present invention, the emitter metallization 15 is alloyed in. In a sixteenth step of the method of the present invention, the exposed portions of the uppermost semiconductor layer 6, i.e., those portions thereof located outside of the regions provided with metallization, are etched away.

Figure 8:
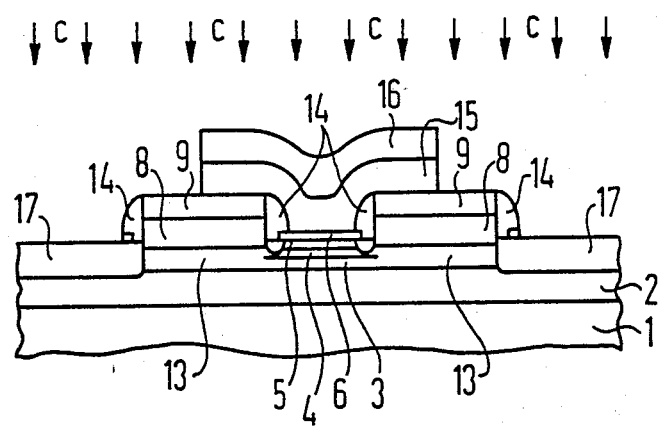
FIG. 8 illustrates a cross-sectional view of an emitter-base complex following either a seventeenth or eighteenth method step, depending on the embodiment of the present invention.

In a seventeenth step of the method of the present invention, those portions of the semiconductor layer structure 2, 3, 4, 5 located outside of the regions of the surface occupied by the base and emitter are rendered insulating by an insulation implantation (c) at that side facing away from the substrate 1 down to and including the p-conductively doped semiconductor layer 3. FIG. 8 illustrates a cross-sectional view of an emitter-base complex following this seventeenth method step.

Figure 9:
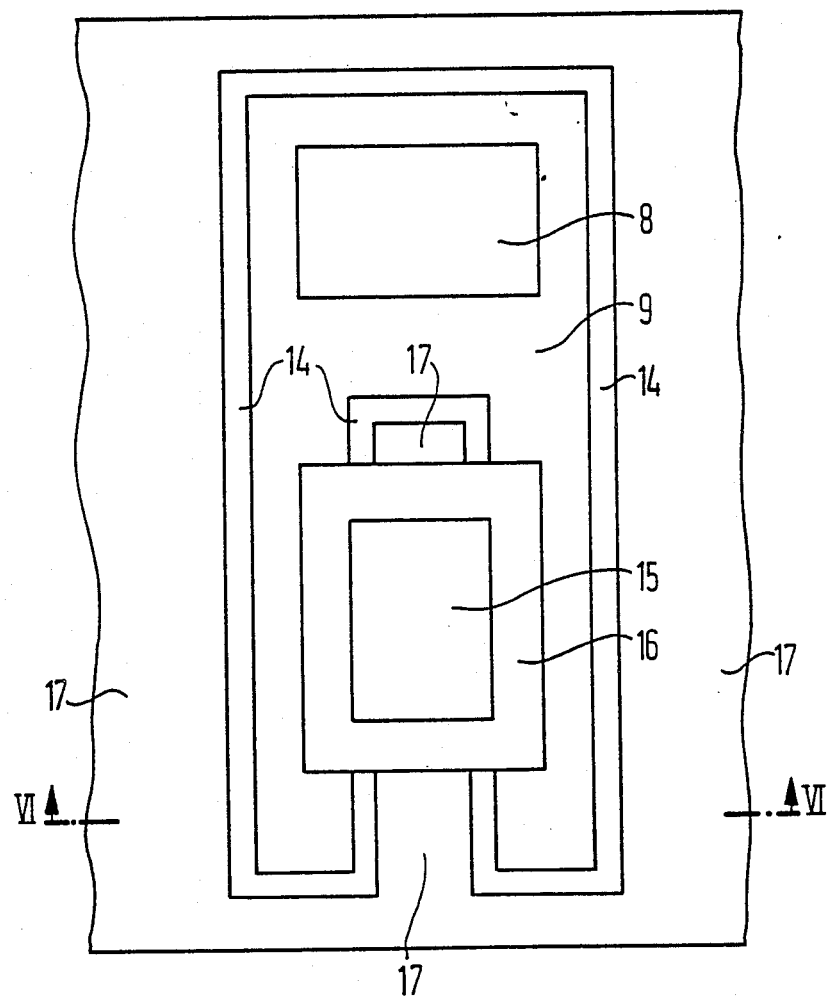
FIG. 9 illustrates a plan view of an emitter-base complex after the via holes for the base and emitter have been etched out.

After the manufacture of the collector, the via holes for the base, emitter, and collector are simultaneously manufactured through an etching process. FIG. 9 illustrates a plan view of an emitter-base complex of the finished transistor without electrodes.

In an embodiment of the method of the present invention following the tenth process step (FIG. 5), the following steps are performed. In an eleventh step of an embodiment of the method of the present invention, a second metal layer 35 is deposited onto the surface that is provided with the base metallization 8. The second metal layer 35 is deposited thereon surface-wide, i.e., completely covering at least the region of the emitter contact that is to be created.

Figure 10:
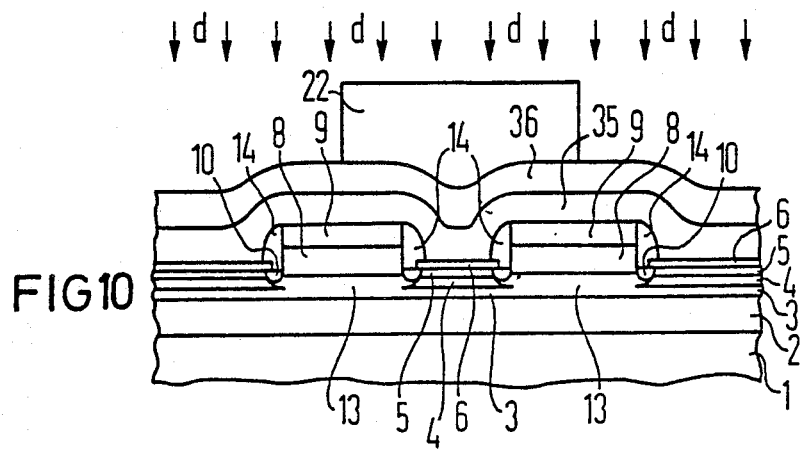
FIG. 10 illustrates a cross-sectional view of an emitter-base complex following a thirteenth method step of an embodiment of the method of the present invention.

In a twelfth step of this embodiment of the method of the present invention, a third dielectric layer 36 is deposited on this second metal layer 35. In a thirteenth step of this embodiment of the method of the present invention, a second mask layer 22 is applied for the definition of the emitter, i.e., for defining the geometrical structure thereof. FIG. 10 illustrates a cross-sectional view of the emitter-base complex following this thirteenth method step.

Figure 11:
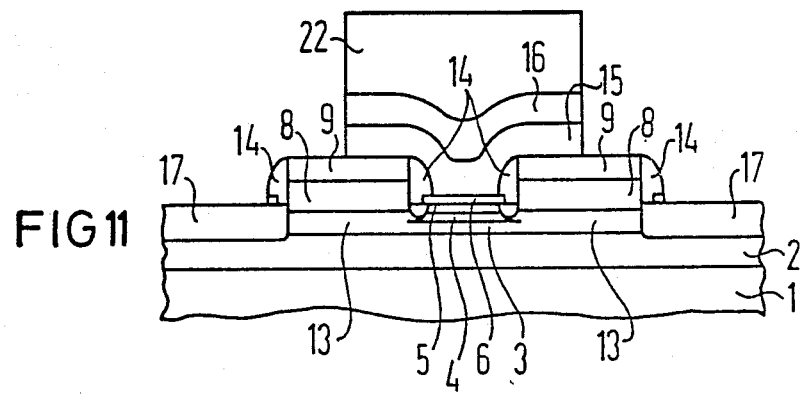
FIG. 11 illustrates a cross-sectional view of an emitter-base complex following a fourteenth method step of an embodiment of the method of the present invention.

Those parts of the second metal layer 35 and of the third dielectric layer 36 not covered by the second mask layer 22 are etched off in a fourteenth step of this embodiment of the present invention. The parts are etched off with anisotropic etching (d), so that only a portion of the second metal layer 35 that represents the emitter metallization 15 remains. FIG. 11 illustrates a cross-sectional view of the emitter-base complex following this fourteenth method step.

In a fifteenth step of this embodiment of the method of the present invention, the second mask layer 22 is removed. In a sixteenth step of this embodiment of the method of the present invention, the emitter metallization 15 is alloyed in. The process step illustrated in FIG. 7 has thus been reached.

In a seventeenth step of this embodiment of the method of the present invention, the exposed portions of the uppermost semiconductor layer 6 are etched away. In an eighteenth step of this embodiment of the method of the present invention, those portions of the semiconductor layer structure 2, 3, 4, 5 located outside the regions of the surface occupied by base and emitter are rendered insulating by an insulation implantation (c) at that side facing away from the substrate 1 down to and including the p-doped semiconductor layer 3. The emitter-base complex now has the structure illustrated in cross section in FIG. 8. The manufacture of the collector, the etching of the via holes (FIG. 9), and the application of electrodes then follows.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for the manufacture of a planar, self-aligned emitter-base complex including a substrate of semiconductor material, a semiconductor layer structure for hetero-bipolar transistors that is grown thereon, whereby at least one semiconductor layer is doped for the conductivity type of the base, including a passivation layer, including base metallization and a portion of a first dielectric layer situated thereon, and including emitter metallization and a portion of a second dielectric layer situated thereon, the method utilizing phototechnique and lift-off technique, etching technique, implantation and tempering processes, comprising the steps of:
   (a) proceeding from the substrate having the semiconductor layer structure grown thereon, a passivation layer is deposited surface-wide on the uppermost of the semiconductor layers;
   (b) a first mask layer having an opening for the definition of the base is applied;
   (c) an implantation of doping for the conductivity type of the base proceeds first for the formation of a implantated base region through the passivation layer at least down to the semiconductor layer doped for the conductivity type of the base;
   (d) the passivation layer and the uppermost semiconductor layer are etched away in those regions occupied by the opening of the first mask layer that serves the purpose of defining the base;
   (e) a first metal layer including a first portion as base metallization and having a second portion is applied on the first mask layer;
   (f) a high-temperature resistant metal is used as the first metal layer allowing the base metallization to not be negatively influenced by a subsequent tempering cycle for annealing the implantation;
   (g) a first dielectric layer having a first portion on the base metallization and having a second portion on the second portion of the first metal layer is deposited;
   (h) the first mask layer together with the second portion of the first metal layer and the second portion of the first dielectric layer are removed in a lift-off technique;
   (i) a temperature-time cycle is carried out with which the implanted dopant is annealed and the base metallization is alloyed in at the same time;
   (j) a second dielectric layer is isotropically deposited;
   (k) the second dielectric layer and the passivation layer are etched away to such an extent with anisotropic etching that only spacers completely covering the sides of the base metallization remain;
   (l) a second mask layer for the definition of the emitter is applied;
   (m) a second metal layer having a first portion as emitter metallization and having a second portion is applied on the second mask layer;
   (n) a third dielectric layer having a first portion on the emitter metallization and a second portion on the second portion of the second metal layer is applied;
   (o) the second mask layer together with the second portion of the second metal layer and the second portion of the third dielectric layer are removed in a lift-off technique;
   (p) the emitter metallization is alloyed in;
   (q) the exposed portions of the uppermost semiconductor layer are etched away; and
   (r) those portions of the semiconductor layer structure situated outside of the regions of the surface occupied by emitter and base are rendered insulating by insulation implantation at that side facing away from the substrate down to and including the semiconductor layer doped for the conductivity type of the base.

2. The method of claim 1 wherein the insulation implantation is performed between the seventh and eighth method steps, resulting in the insulation implantates electrically insulating the base metallization from the upper regions of the semiconductor layer structure that are not doped for the conductivity type of the base.

3. The method of claim 1 wherein the insulation implantation is performed between the eighth and ninth method steps, resulting in the insulation implantates electrically insulating the base metallization from the upper regions of the semiconductor layer structure that are not doped for the conductivity type of the base.

4. The method of claim 1 wherein the passivation layer and the second dielectric layer are $Si_3N_4$.

5. The method of claim 1 wherein the first dielectric layer and the third dielectric layer are $SiO_2$.

6. The method of claim 1 wherein the insulation implantation is carried out with boron.

7. The method of claim 1 wherein the high-temperature stable base metallization is chosen from the group consisting of titanium and an alloy having titanium.

8. The method of claim 1 wherein:
the substrate is semi-insulating GaAs; and
a first semiconductor layer of GaAs doped for the conductivity type is provided for emitter and collector, a second semiconductor layer of GaAs doped for the conductivity type is provided for the base, a third semiconductor layer of AlGaAs doped for the conductivity type of the emitter is provided, a fourth semiconductor layer of GaAs doped for the conductivity type is provided for emitter and collector, and a fifth semiconductor layer of GaAs highly doped for the conductivity type provided for emitter and collector are grown on said substrate in this sequence.

9. The method of claim 1 wherein the base comprises the conductivity type of n-conduction and the emitter and the collector comprise the conductivity type of p-conduction.

10. The method of claim 1 wherein the base comprises the conductivity type of p-conduction and the emitter and the collector comprise the conductivity type of n-conduction.

11. A method for the manufacture of a planar, self-aligned emitter-base complex including a substrate of semiconductor material, a semiconductor layer structure for hetero bipolar transistors that is grown thereon, whereby at least one semiconductor layer is doped for the conductivity type of the base, including a passivation layer, including base metallization and a portion of a first dielectric layer situated thereon, and including emitter metallization and a portion of a second dielectric layer situated thereon, the method utilizing phototechnique, lift-off technique, etching technique, implantation and tempering processes, comprising the steps of:
  (a) proceeding from the substrate having the semiconductor layer structure grown thereon, a passivation layer is deposited surface-wide on the uppermost of these semiconductor layers;
  (b) a first mask layer including an opening for the definition of the base is applied;
  (c) an implantation of doping for the conductivity type of the base proceeds first for the formation of implanted base region through the passivation layer at least down to the semiconductor layer doped for the conductivity type of the base;
  (d) the passivation layer and the uppermost semiconductor layer are etched away in the regions occupied by the opening of the first mask layer serving for the definition of the base;
  (e) a first metal layer having a first portion as base metallization and having a second portion on the first mask layer is applied;
  (f) a high-temperature resistant metal is used for this first metal layer, allowing the base metallization is not be negatively influenced by a following tempering cycle for annealing the doping;
  (g) a first dielectric layer having a first portion on the base metallization and having a second portion on the second portion of the first metal layer is deposited;
  (h) the first mask layer together with the second portion of the first dielectric layer are removed in lift-off technique;
  (i) a temperature-time cycle is performed with which the implanted doping is annealed and the base metallization is alloyed in at the same time;
  (j) a second dielectric layer is isotropically deposited;
  (k) the second dielectric layer and the passivation layer are etched away to such an extent with anisotropic etching that only spacers completely covering the sides of the base metallization remain;
  (l) a second metal layer is deposited onto the surface comprising the base metallization;
  (m) a third dielectric layer is deposited on the second metal layer;
  (n) a second mask layer is applied for the definition of the emitter;
  (o) those parts of the second metal layer and of the third dielectric layer not covered by the second mask layer are etched away with anisotropic etching, so that only the emitter metallization of this second metal layer remains;
  (p) the second mask layer is removed;
  (q) the emitter metallization is alloyed in;
  (r) the exposed portions of the uppermost semiconductor layer are etched away; and
  (s) those portions of the semiconductor layer structure situated outside of the regions of the surface occupied by base and emitter are rendered insulating by insulation implantation at that side facing away from the substrate down to and including the semiconductor layer doped for the conductivity type of the base.

12. The method of claim 11 wherein an insulation implantation is performd between the execution of the seventh and eighth method steps, resulting in that the insulation implantation electrically insulates the base metallization from the upper regions of the semiconductor layer structure that are not doped for the conductivity type of the base.

13. The method of claim 11 wherein an insulation implantation is performed between the eighth and ninth method steps, resulting in the insulation implantation electrically insulates the base metallization from the upper regions of the semiconductor layer structure that are not doped for the conductivity type of the base.

14. The method of claim 11 wherein the passivation layer and the second dielectric layer are $Si_3N_4$.

15. The method of claim 11 wherein the first dielectric layer and the third dielectric layer are $SiO_2$.

16. The method of claim 11 wherein the insulation implantation is carried out with boron.

17. The method of claim 11 wherein the high-temperature stable base metallization is chosen from the group consisting of titanium and an alloy having titanium.

18. The method of claim 11 wherein:
the substrate is semi-insulating GaAs; and
a first semiconductor layer of GaAs doped for the conductivity type is provided for emitter and collector, a second semiconductor layer of GaAs doped for the conductivity type is provided for the base, a third semiconductor layer of AlGaAs doped for the conductivity type of the emitter is provided, a fourth semiconductor layer of GaAs doped for the conductivity type is provided for emitter and collector, and a fifth semiconductor layer of GaAs highly doped for the conductivity type provided for emitter and collector are grown on said substrate in this sequence.

19. The method of claim 11 wherein the base comprises the conductivity type of n-conduction and the emitter and the collector comprise the conductivity type of p-conduction.

20. The method of claim 11 wherein the base comprises the conductivity type of p-conduction and the emitter and the collector comprise the conductivity type of n-conduction.

* * * * *